United States Patent
Braddock

(10) Patent No.: US 6,573,528 B2
(45) Date of Patent: Jun. 3, 2003

(54) DETECTOR DIODE WITH INTERNAL CALIBRATION STRUCTURE

(76) Inventor: Walter David Braddock, 300 First St., NE., Rochester, MN (US) 55906-3714

( * ) Notice: Subject to any disclaimer, the term of this patent is extended or adjusted under 35 U.S.C. 154(b) by 0 days.

(21) Appl. No.: 09/976,907

(22) Filed: Oct. 12, 2001

(65) Prior Publication Data

US 2002/0113285 A1 Aug. 22, 2002

Related U.S. Application Data

(60) Provisional application No. 60/240,457, filed on Oct. 12, 2000.

(51) Int. Cl.[7] ............... H01L 31/0328; H01L 31/0336; H01L 33/00
(52) U.S. Cl. ............... 257/14; 257/12; 257/14; 257/15; 257/16; 257/17; 257/18; 257/22; 257/94; 257/96; 257/97; 257/103; 257/183; 257/199; 257/200; 257/472; 257/631
(58) Field of Search ............... 257/12, 183, 199–200, 257/472, 631, 14, 15, 16, 17, 18, 22, 94, 96, 97, 103

(56) References Cited

U.S. PATENT DOCUMENTS

| | | | | |
|---|---|---|---|---|
| 5,170,407 A | * | 12/1992 | Schubert et al. | 372/96 |
| 5,323,053 A | * | 6/1994 | Luryi et al. | 257/485 |
| 5,425,043 A | * | 6/1995 | Holonyak et al. | 372/50 |
| 5,491,712 A | * | 2/1996 | Lin et al. | 372/50 |
| 5,729,563 A | * | 3/1998 | Wang et al. | 372/50 |
| 5,805,624 A | * | 9/1998 | Yang et al. | 372/45 |
| 5,838,708 A | * | 11/1998 | Lin et al. | 372/50 |
| 5,896,408 A | * | 4/1999 | Corzine et al. | 372/46 |
| 5,953,362 A | * | 9/1999 | Pamulapati et al. | 372/96 |
| 6,028,693 A | * | 2/2000 | Fork et al. | 359/248 |
| 6,252,896 B1 | * | 6/2001 | Tan et al. | 372/50 |
| 6,347,104 B1 | * | 2/2002 | Dijaili et al. | 372/38.01 |

* cited by examiner

*Primary Examiner*—Amir Zarabian
*Assistant Examiner*—Ida M. Soward

(57) ABSTRACT

This patent is generally directed towards a method and device for providing a diode structure that has a barrier height that may be readily engineered with a series resistance that may be independently varied while simultaneously providing for the complete characterization and discernment of the barrier height in a microwave and millimeter-wave rectifying diode without the need for device fabrication and electrical measurement. The present invention generally relates to microwave and millimeter-wave diodes, and more particularly to low barrier structures within these diodes that are capable of rectification of microwave and millimeterwave radiation. The diode structure comprises a semiconductor substrate, a verification structure consisting of alternating layers of binary compound semiconductors that exist in crystalline form on said substrate, a doped contact layer with sufficient doping and thickness to provide for the formation of electrical contact with ohmic behavior, a barrier structure consisting of some combination of multiple heterojunctions and alternating layers that may be periodic in nature or of a chirped superlattice nature in said barrier, and a doped contact layer that is of the proper thickness and doping to allow the formation of a sufficient electrical contact with ohmic or partly resistive nature as necessary for the required contact.

18 Claims, 9 Drawing Sheets

| Layer No. | Measured Thickness(Å) (X-Ray) | Target Thickness (Å) | Doping (cm$^{-3}$) | Description | Comment |
|---|---|---|---|---|---|
| 22 | 5,318.3 | 5,000 | 4.00E18 | GaAs:Si | contact |
| 21 | 6 | 6 | | GaAs | Spacer |
| 20 | 59.3, x=.6626 | 60 | | Al.3Ga.7As | Period 5 |
| 19 | 13.7 | 15 | | GaAs | Period 5 |
| 18 | 50.4, x=.6686 | 50 | | Al.3Ga.7As | Period 4 |
| 17 | 24 | 25 | | GaAs | Period 4 |
| 16 | 39.1, x=.6648 | 40 | | Al.3Ga.7As | Period 3 |
| 15 | 30.3 | 35 | | GaAs | Period 3 |
| 14 | 26.1, x=.6676 | 30 | | Al.3Ga.7As | Period 2 |
| 12 | 49.1 | 45 | | GaAs | Period 2 |
| 12 | 15.8, x=.6633 | 20 | | Al.3Ga.7As | Period 1 |
| 11 | 55.2 | 55 | | GaAs | Period 1 |
| 10 | 11.1, x=.6651 | 10 | | Al.3Ga.7As | Bottom barrier |
| 9 | 6 | 6 | | GaAs | Spacer |
| 8 | 11,937.8 | 10,000 | 4.00E18 | GaAs:Si | Doped Contact |
| 3,5,7 | 516.4 | 500 | nid | GaAs | 3 repetitions (minimum) |
| 2,4,6 | 534.4 | 500 | nid | AlAs | 3 repetitions (minimum) |
| 1 | | 2,000 | nid | GaAs | buffer |
| 0 | | | | GaAs Substrate | |

Figure 2

Black: X-Ray Diffraction Data, Gray:Theoretical Spectra

X-Ray Diffraction Theory

X-Ray Diffraction Data

DETECTOR DIODE WITH INTERNAL CALIBRATION STRUCTURE

CROSS-REFERENCE TO RELATED APPLICATIONS

This application is based upon a provisional application with a filing date of Oct. 12, 2000, and an application No. of 60/240,457, the entire disclosure of which is hereby incorporated by reference

STATEMENTS REGARDING FEDERALLY SPONSORED RESEARCH OR DEVELOPMENT
+ps Not applicable

FIELD OF THE INVENTION

The present invention generally relates to type III–V semiconductor devices, and more particularly to a digitally graded rectifying structure for use in a GaAs semiconductor device.

BACKGROUND OF THE INVENTION

Gallium arsenide (GAAs) semiconductor devices have several advantages over their silicon counterparts. In particular, GaAs devices exhibit faster and more optimized speed/power performance and efficiency at a low supply voltage of 1 volt and below. In prior art, diodes which contain a potential barrier diodes have been widely used as the detector elements in microwave and milli-meterwave rectifiers, receivers, and imaging systems. Each of these particular devices have limitations in performance and manufacturability. One particular type of low barrier diode, The Schottky Barrier Diode, may be fabricated from either silicon or on compound semiconductor substrates such as GaAs or InP. The barrier height in this type of diode has its barrier height predetermined by the metal-semiconductor barrier. The barrier height is not readily adjustable in the Schottky barrier diode, and the resistance of the diode is not independently adjustable either. In order to obtain microwave diodes with engineered barrier heights, rectifier diodes with n-i-p-i-n junctions and n-p-n junctions have been demonstrated such as those outlined in U.S. Pat. No. 4,410,902. These planar doped barrier semiconductor devices allow for adjustable barrier heights, but are not manufacturable because attomole or femtomole levels of semiconductor dopant must be incorporated into less than 5 angstroms of semiconductor material. The variability in the production of these thin structures with such miniscule levels of dopant is not reproducible by using even the modern methods of Molecular Beam Epitaxy of Metal Organic Chemical Vapor Deposition.

SUMMARY OF THE INVENTION

This patent is generally directed towards a method and device for providing a diode structure that has a barrier height that may be readily engineered with a series resistance that may be independently varied while simultaneously providing for the complete characterization and discernment of the barrier height in a microwave and millimeter-wave rectifying diode without the need for device fabrication and electrical measurement. The present invention generally relates to microwave and millimeter-wave diodes, and more particularly to low barrier structures within these diodes that are capable of rectification of microwave and millimeterwave radiation. The diode structure comprises a semiconductor substrate, a periodic structure consisting of alternating layers on binary compound semiconductors that exist in crystalline form on said substrate, a doped contact layer with sufficient doping and thickness to provide for the formation of electrical contact with ohmic behavior, a barrier structure consisting of some combination of multiple heterojunctions and alternating layers that may be periodic in nature or of a chirped superlattice nature in said barrier, and a doped contact layer that is of the proper thickness and doping to allow the formation of a sufficient electrical contact with ohmic or partly resistive nature as necessary for the required contact.

DESCRIPTION OF INVENTION FIGURES

FIG. 1 shows an example of the invention as expressed and fabricated upon a GaAs substrate.

FIG. 2 shows an example of an actual demonstrated structure that contains 22 individual layers that form items 10 through 50 in FIG. 1.

DESCRIPTION OF THE PREFERRED EMBODIMENT

This application claims crystal growth techniques such as Molecular Beam Epitaxy and Metal Organic Chemical Vapor Deposition are well know and mature technologies to those skilled in the art of compound semiconductor growth. However, inspite of claims made regarding monolayer reproducilibty and control such as those made in, "Structure Grown by Molecular Beam Epitaxy", L. L. Chang, et. Al., J. Vac. Sci Technol., Vol. 10, No 5, September/October 1973, page 655 and following which are incorporated by reference, the variability of control at the atomic level in both composition and doping is lacking in these crystal growth techniques. In particular, the absence of reproducibility for both doping and thickness caused by process drift is so severe that more recent publications entitled, "Microwave Tunnel Diodes Are Not Yet Manufacturable", Superlattices and Microstructures, Vol. 24, No. 4, pages 309–312, 1998, highlight the limitations and problems in these crystal growth techniques.

In order to overcome the drift in doping that limits realization and production of microwave and millimeter-wave rectifiers and diodes with specific and focused characteristics, a semiconductor structure is disclosed that contains both a quality verification region and a microwave diode region. In addition, the quality verification region invented is configured such that the barrier and electrical contact regions may be non-destructively characterized immediately after crystal growth in an unambiguously manner with a resolution of less than 1 angstrom and 1 atomic percent composition of said semiconductor constituent. Thus, the invention allows for the direct and rapid determination of the barrier height and diode performance immediately after crystal growth and before costly and time consuming semiconductor device fabrication and electrical measurement. In the current state of the art, the performance of microwave and millimeterwave diodes may only be determined after said fabrication and electrical measurement.

The constituent parts of the invention as well as its electrical characteristics are described in FIGS. 1 through 10. A specific example of the diode structure is shown and characterized using X-ray diffraction techniques in FIGS. 2–10, and this structure is meant as one particular illustration of the invention and not as a limiting case. Therefore, the invention may be interpreted into other compound semiconductors such as SiGe, InP, or GaSb based materials systems known by those skilled in the art.

Figure 1:
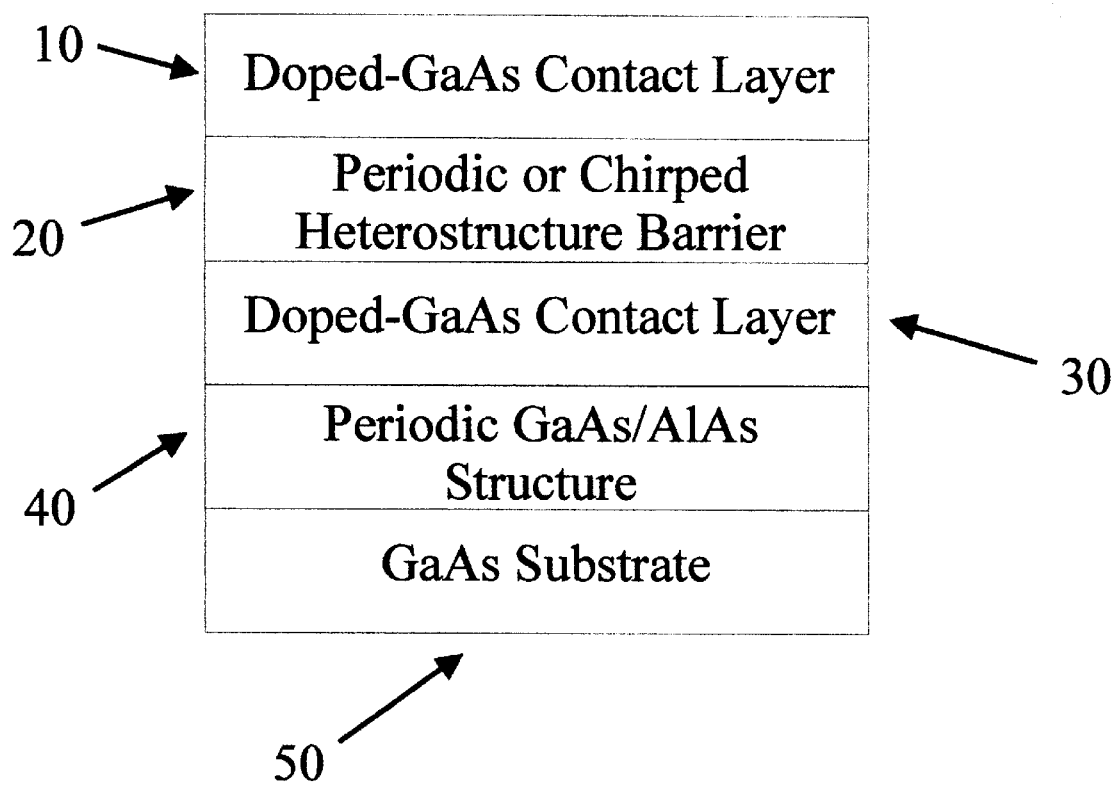

Referring to FIG. 1, the substrate 50, forms the bottom of the structure and provides electrical, thermal, and mechanical support. The periodic structure 40, is chosen in this embodiment to consist of AlAs/GaAs binary semiconductor structures that are approximately of equal thickness. Additionally, the thickness of the periodic structure and the number of repetitions is determined so that multiple and discerning peaks and features are produced in the X-ray rocking curve spectra as show in FIGS. 5 and 6. In the structure of FIG. 1, the doped contact layers that surround the barrier on the diode structure are 10 and 40 respectively. The periodic structure 20, may consist of a single or multiple heterojunction of GaAs and AlGaAs semiconductors that are arranged in alternating layers. It is clear to those skilled in the art that the basic structure may be replicated or adapted to other substrates such as InP or GaSb or any compound semiconductor system (even those based upon a silicon substrate such as SiGe), and thus the invention includes all structures that are within both the spirit, scope, and architecture of said semiconductor device and its structural characterization.

Referring now to FIG. 2, the substrate is represented by Layer No. 0. The verification structure in FIG. 2 consists of Layer No. 2–7 and is periodic in this embodiment. The barrier in the specific structure of FIG. 2 consists of Layer No. 8–21, and consists of a chirped superlattice structure in this embodiment. The barrier structure in this device is of a chirped nature which is constructed such that each period of GaAs/AlGaAs layers has approximately the same overall thickness (appriximately 75 angstroms in the example of FIG. 2) while allowing the thickness of the individual layers to vary monotonically within each single period or repetition. While the layers in this range are not specifically doped it is within the scope of this example and structure to provide for doping in the barrier region in order to adjust either the microwave or DC resistance of the diode structure as necessary. The top layer 22 in FIG. 2 acts as the topmost electrical contact in this device.

Figure 3:
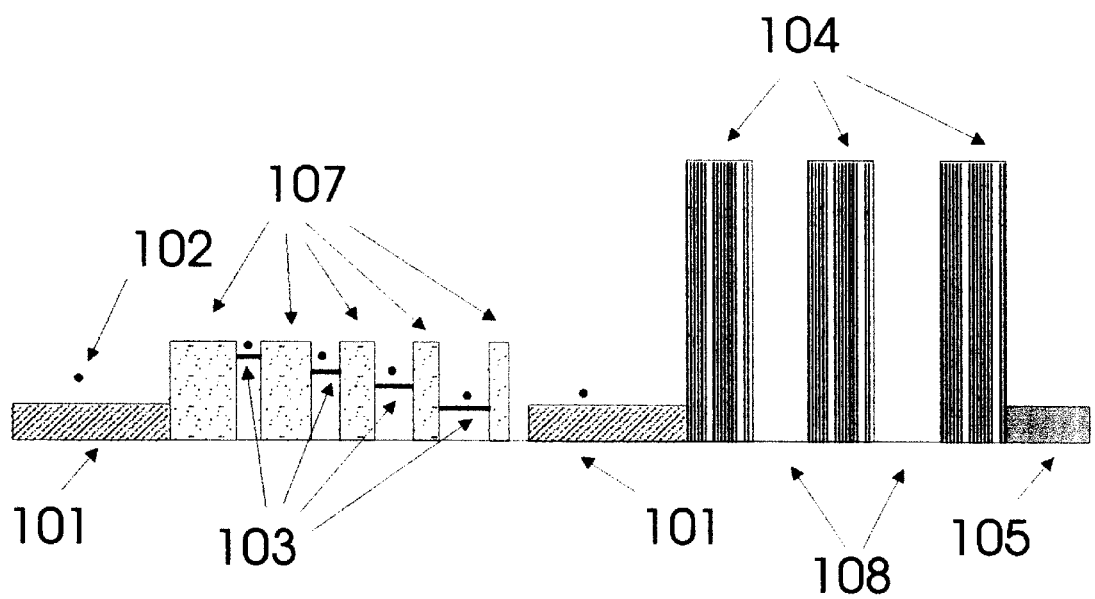
FIG. 3 shows that real space band structure of the invention as well as the approximate position of quantum states (103) in the chriper barrier region.

FIG. 3 discloses an embodiment of the electrical band structure of the combined diode and verification a periodic structure. The verification structure 104 and 108 is periodic in nature and is often referred to have optical properties of a Bragg Mirror by those skilled in the art. The electrical contacts 101, surrounding the barrier region 107 and 103, and the periodic structure 104 and 108 are used together for structural verification. Immediately adjacent to the device structure consisting of 101,103 and 107, is shown the AlAs/GaAs periodic structure 104 and 108. In practice, an electron 102 travels from the left electrical contact through the quantum well/quantum barrier states 103, to the electrical contact 101 on the right. The AlAs/GaAs periodic structure 104/108, consists of a larger bandgap semiconductor and a smaller bandgap semiconductor that have slightly differing lattice constants that allow non-arbitrary measurement of layer thickness and growth rate in Molecular Beam Epitaxy if the time for the growth of each layer is accurately recorded. The slight difference in lattice constant is simply a change in the inter-atomic spacing between the atoms that exists in 104 and 108. It is this difference that allows the X-ray techniques (reflectivity o Diffraction) to be readily used to determine the structure to better than 0.2 angstroms. Relating back to FIG. 2, period structure 104, is identified on FIG. 2 as Layer No. 2,4,6, and might be composed of AlAs while GaAs periodic structure 108 is identified on FIG. 2 as Layer No. 3,5,7 and may be composed of GaAs for example. The entire structure is supported upon substrate 105.

Figure 4:
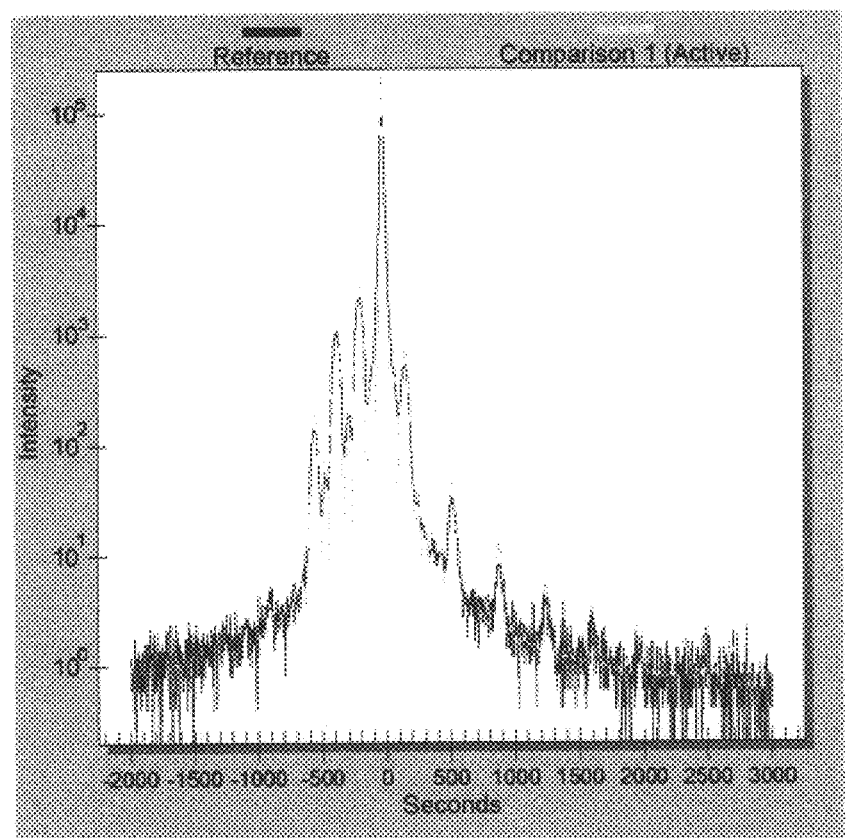
FIG. 4 shows the experimentally determined and theoretical calculated X-ray Diffraction Rocking Curve Spectra that are produced by the invention.

Referring now to FIG. 4, which shows the experimentally determined and theoretical calculated X-ray Diffraction Rocking Curve Spectra that are produced by the invention. The sharp peaklike features are produced mainly by the periodic binary semiconductor structure that is the verification structure in the preffered embodiment. It is well known by those skilled in the art of compound semiconductor epitaxial growth techniques such as Molecular Beam Epitaxy or Chemical Beam Epitaxy or Metal Organic Chemical Vapor Deposition that the binary growth rates in this periodic structure may be fixed to provide a means of crystal growth for both the periodic structure and a controlled and exact means for producing both the electrical contact region and barrier region of the semiconductor diode device that may contain ternary compound semiconductor layers.

Figure 5:
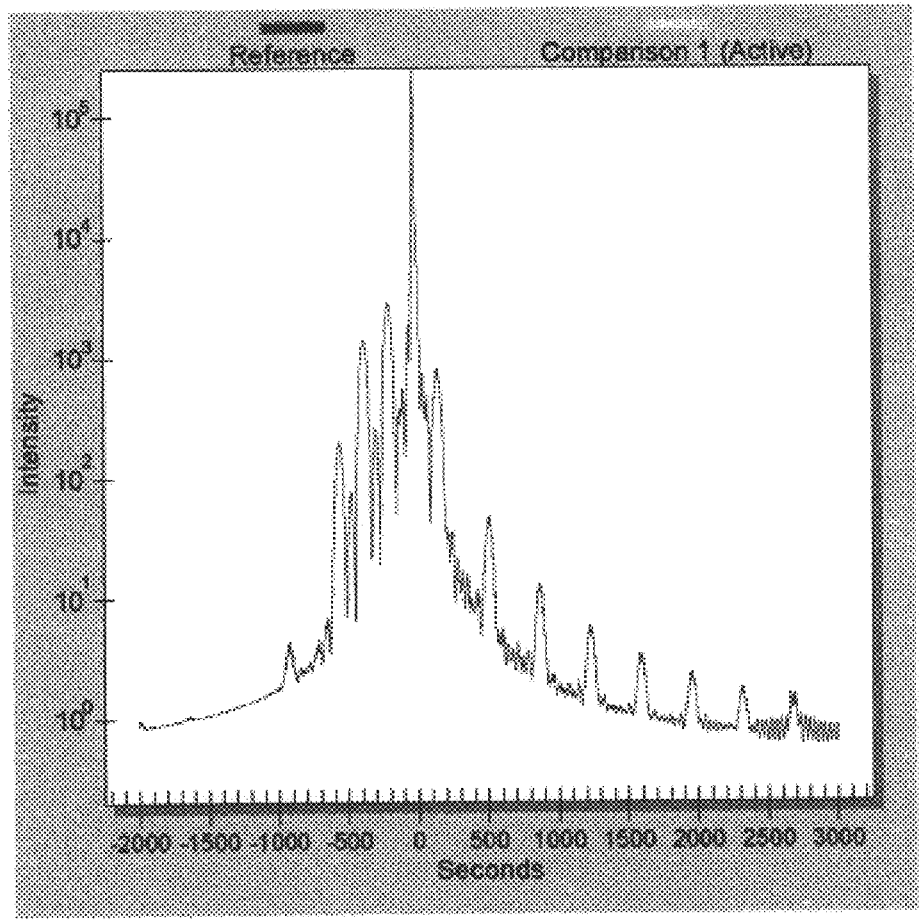
FIG. 5 shows that theoretical calculated X-ray diffraction rocking curve spectra produced by the device of FIG. 2.
Figure 6:
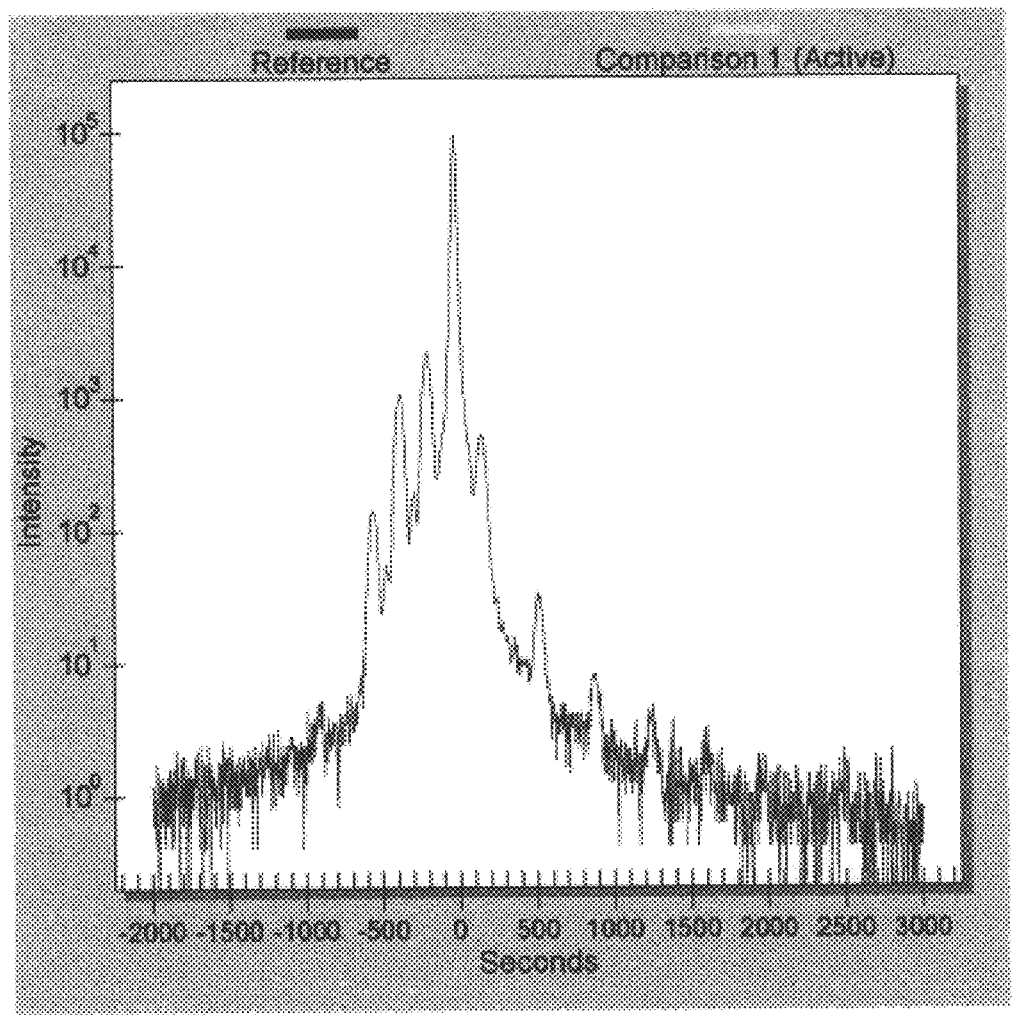
FIG. 6 shows that experimentally measured X-ray diffraction rocking curve spectra produced by the device of FIG. 2.
Figure 7:
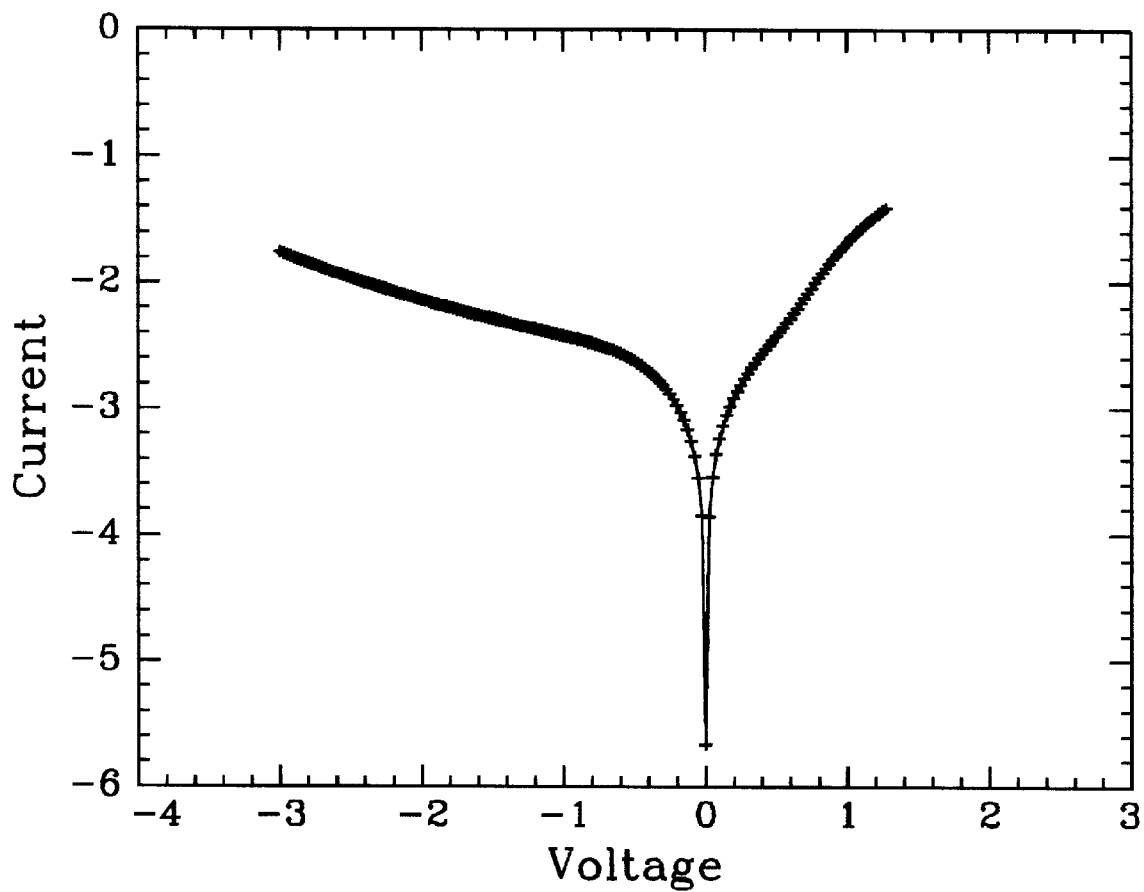
FIG. 7 shows the electrical characteristics and the asymmetrical current voltage behavior of diodes fabricated using mesa isolation and airbrigde techniques for electrical contacts.
Figure 8:
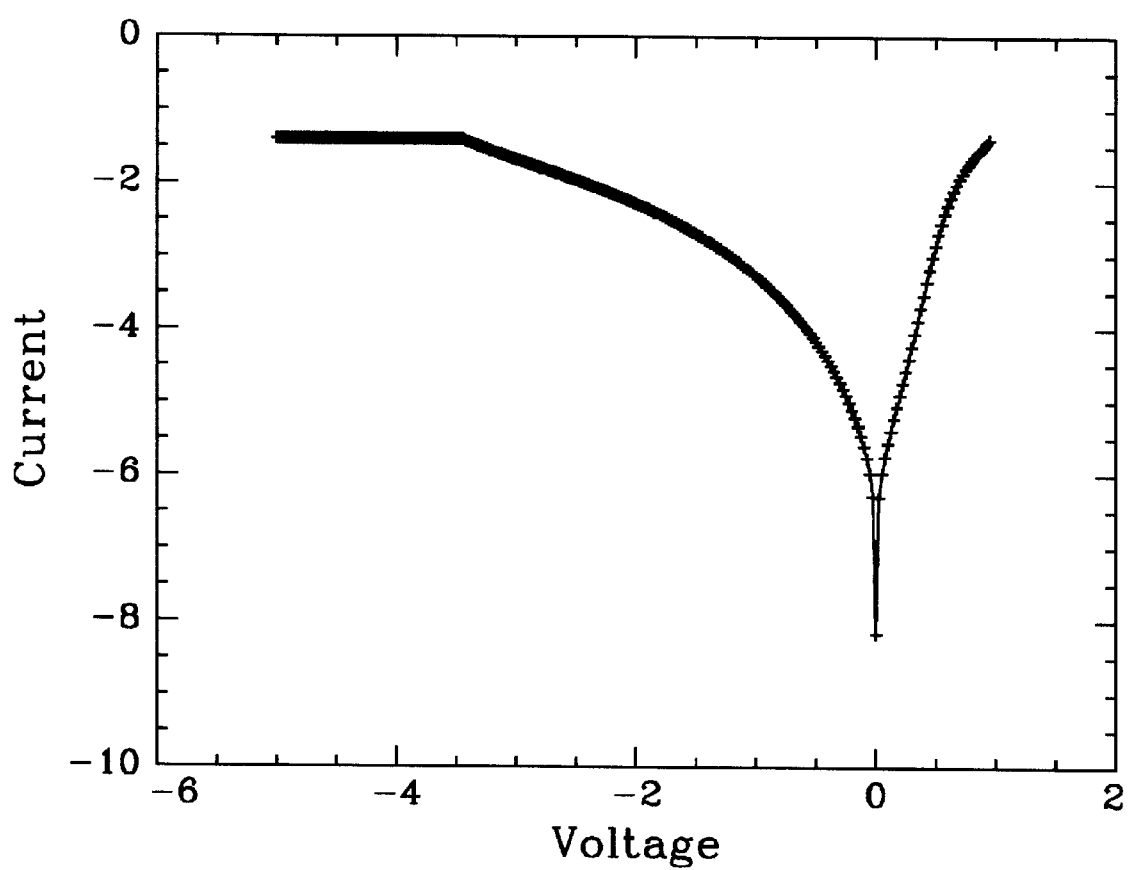
FIG. 8 shows electrical current versus voltage data of a sample of the invention.
Figure 9:
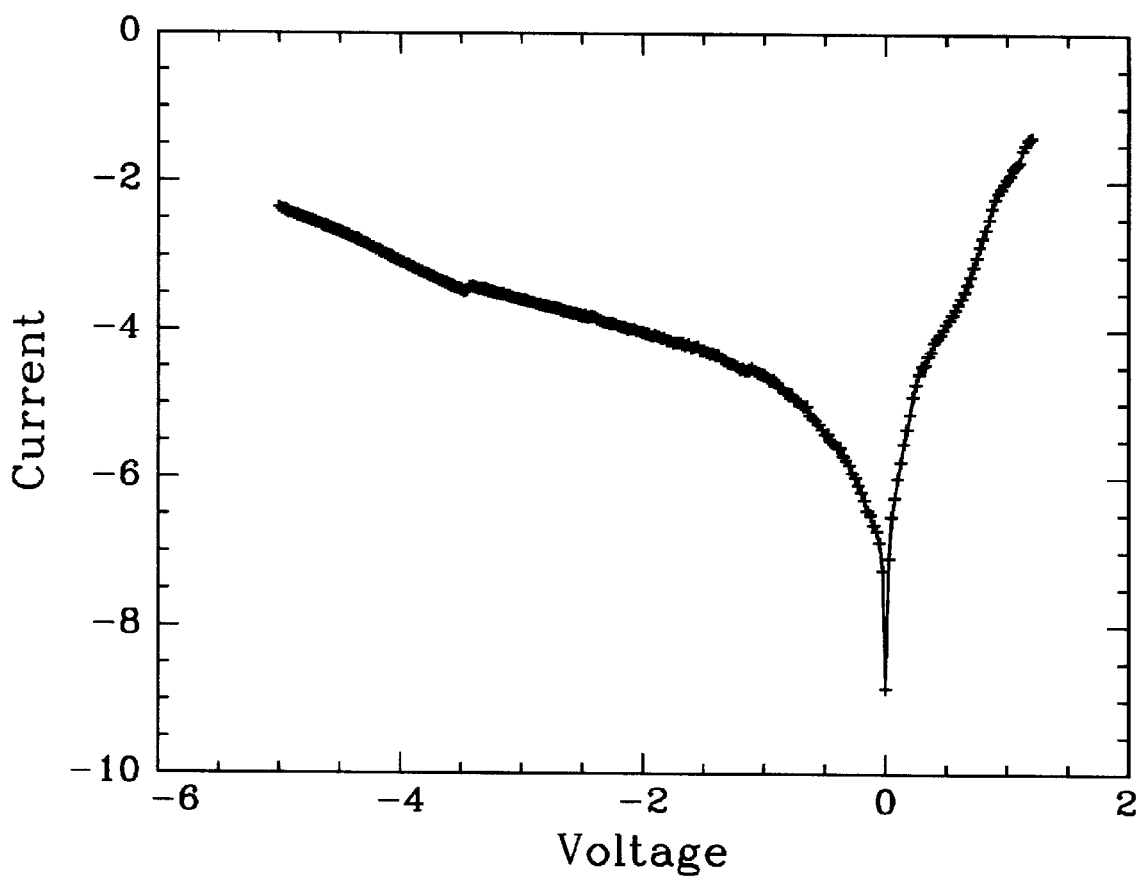
FIG. 9 shows electrical current versus voltage data of a sample of the invention.

FIG. 5 shows that theoretical calculated X-ray diffraction rocking curve spectra produced by the device of FIG. 2. FIG. 6 shows that experimentally measured X-ray diffraction rocking curve spectra produced by the device of FIG. 2. FIG. 7 shows the electrical characteristics and the asymmetrical current voltage behavior of diodes fabricated using mesa isolation and airbrigde techniques for electrical contacts. This electrical testing data is measured by applying a constant voltage at steading increasing values to the structure, and recordeing the current that flows through the device. The current in the preffered embodiment flows only through the 101, 103, 107 in the electrical testing and does not necessarily need to pass through the verification structure 104+108 shown in FIG. 3. The barrier region may be modified to change or engineer the rectification properties or measured electrical assymetry. This modification in electrical characteristics may be effected by changing the thickness, spacing, ternary composition, doping in the barrier region or by adding or deleting layers in this region. The electrical data in FIGS. 8 and 9 show that the current voltage characteristics and assymetry may be readily changed by adjusting the structure. In the case changing either the barrier thickness, well thickness, or doping in the barrier region of the semiconductor device.

The structure described in the preffered embodiment is prepared using one of the well know epitaxial crystal growth techniques such as Molecular Beam Epitaxy or Metal Organic Chemical Vapor Deposition such that;

a nucleation layer of semiconductor material is placed on said substrate, a verification structure that typically consists of periodic alternating layers of a binary compound semiconductor layers, the further deposition of a doped electrical contact layer, the further deposition of a heterojunction layer that includes an electrical barrier, followed by the final electrical contact layer.

What is claimed is:

1. A rectifying low baffler structure for use with semiconductor devices, comprising:
   a semiconductor substrate;
   a verification structure comprising alternating layers of AlAs and GaAs, in operational contact with said semiconductor substrate;
   the rectifying low barrier structure in operational contact with said semiconductor substrate; and
   an electrical contact electrically connecting to said rectifying low baffler structure.

2. A structure, comprising:
   a semiconductor substrate;
   a verification structure on said semiconductor substrate, said verification structure comprising a set of verification layers alternating in composition between a first binary compound semiconductor composition and a second binary compound semiconductor composition; and
   a layered barrier structure on said semiconductor substrate, said barrier structure delimited by a first surface and a second surface, said barrier structure comprising a set of layers composed of semiconductor materials such that said barrier structure defines a plurality quantum wells defining a plurality of lowest energy quantum well states, wherein energy of said lowest energy quantum well states generally increases with position between said first surface and said second surface.

3. The structure of claim 2 wherein said set of layers comprises layers of GaAs and layers of AlGaAs.

4. The structure of claim 2 wherein a first combined thickness of a first GaAs layer adjacent a first AlGaAs layer of said set of layers is approximately equal to a second combined thickness of a second GaAs layer adjacent a second AlGaAs layer of said set of layers.

5. The structure of claim 2 wherein a thickness of said layered barrier structure is less than 75 angstroms.

6. The structure of claim 2 wherein said set of layers comprises a plurality of GaAs layers and thickness of each one of said plurality of GaAs layers increases monotonically with distance of each one of said plurality of GaAs layers from said first surface.

7. The structure of claim 2 wherein said set of layers comprises a plurality of GaAlAs layers and thickness of each one of said plurality of GaAs layers increases monotonically with distance of each one of said plurality of GaAlAs layers from said first surface.

8. The structure of claim 2 wherein said set of layers comprises alternating layers of GaAs and AlGaAs including a selected GaAs layer adjacent a selected AlGaAs layer, and a thickness said selected GaAs layer is different from a thickness of said selected AlGaAs layer.

9. The structure of claim 2 wherein said all layers of said set of verification layers have substantially the same thickness as one another.

10. The structure of claim 2 wherein said set of layers comprises at least six layers.

11. The structure of claim 2 wherein first binary compound semiconductor composition consists essentially of GaAs and said second binary compound semiconductor composition consists essentially of AlAs.

12. The structure of claim 2 further comprising a first electrode electrically connected to said first surface and a second electrode electrically connected to said second surface.

13. The structure of claim 12 wherein said verification structure is not electrically connected to said first electrode and said second electrode.

14. A structure of claim 2 wherein at least one layer of said set of layers is doped to a concentration that substantially affects resistance of said structure.

15. A method for rectifying microwave radiation, comprising:
   providing a structure comprising:
      a semiconductor substrate;
      a verification structure on said semiconductor substrate, said verification structure comprising a set of verification layers alternating in composition between a first binary compound semiconductor composition and a second binary compound semiconductor composition; and
      a layered barrier structure on said semiconductor substrate, said barrier structure delimited by a first surface and a second surface, said barrier structure comprising a set of layers composed of semiconductor materials such that said barrier structure defines a plurality quantum wells defining a plurality of lowest energy quantum well states, wherein energy of said lowest energy quantum well states generally increases with position between said first surface and said second surface;
   receiving microwave radiation in said structure; and
   generating a current across said layered barrier structure resulting from receipt by said structure of said microwave radiation.

16. The method of claim 15 wherein a thickness of said layered barrier structure is less than 75 angstroms.

17. A method for estimating thickness of layers of a layered barrier structure, comprising:
   providing a structure comprising:
      a semiconductor substrate;
      a verification structure on said semiconductor substrate, said verification structure comprising a set of verification layers alternating in composition between a first binary compound semiconductor composition and a second binary compound semiconductor composition; and
      a layered barrier structure on said semiconductor substrate, said barrier structure delimited by a first surface and a second surface, said barrier structure comprising a set of layers composed of semiconductor materials such that said barrier structure defines a plurality quantum wells defining a plurality of lowest energy quantum well states, wherein energy of said lowest energy quantum well states generally increases with position between said first surface and said second surface;
   determining verification layer thickness of said set of verification layers via X-ray diffraction;
   determining growth rates of said set of verification layers based upon growth time and said and
   estimating thickness of layers of said layered barrier structure based upon measured growth rates calibrated to thickness of said verification layers determined from X-ray diffraction data.

18. The method of claim 17 wherein a thickness of said layered barrier structure is less than 75 angstroms.

* * * * *